(12) United States Patent (10) Patent No.: US 8,765,214 B2
Moosbrugger et al. (45) Date of Patent: Jul. 1, 2014

(54) CLEANING METHOD FOR COATING SYSTEMS

(75) Inventors: Arno Moosbrugger, Hard (AT); Mario Walch, Balzers (LI); Siegfried Krassnitzer, Feldkirch (AT); Stephan Kasemann, Feldkirch (AT); Jürgen Gwehenberger, Wangs (CH)

(73) Assignee: Oerlikon Trading AG, Truebbach, Truebbach (CH)

( * ) Notice: Subject to any disclaimer, the term of this patent is extended or adjusted under 35 U.S.C. 154(b) by 341 days.

(21) Appl. No.: 13/130,091

(22) PCT Filed: Nov. 11, 2009

(86) PCT No.: PCT/CH2009/000355
§ 371 (c)(1),
(2), (4) Date: Aug. 3, 2011

(87) PCT Pub. No.: WO2010/057323
PCT Pub. Date: May 27, 2010

(65) Prior Publication Data
US 2011/0281026 A1 Nov. 17, 2011

Related U.S. Application Data

(60) Provisional application No. 61/116,461, filed on Nov. 20, 2008.

(51) Int. Cl.
*B65B 33/00* (2006.01)
*C09D 5/00* (2006.01)

(52) U.S. Cl.
USPC .......................... 427/154; 427/155; 427/156

(58) Field of Classification Search
USPC ........... 118/70, 715, 723 R, 726; 134/4, 22.1, 134/38; 427/143, 154, 155, 156, 140, 142; 106/2
See application file for complete search history.

(56) References Cited

U.S. PATENT DOCUMENTS

| | | | | |
|---|---|---|---|---|
| 2,991,188 A | * | 7/1961 | Wing et al. | 216/12 |
| 4,548,967 A | * | 10/1985 | Brown et al. | 524/56 |
| 4,748,049 A | | 5/1988 | Charles et al. | |
| 4,895,630 A | | 1/1990 | Aufderheide | |
| 5,578,131 A | * | 11/1996 | Ye et al. | 118/723 R |
| 5,622,565 A | | 4/1997 | Ye et al. | |
| 5,972,114 A | * | 10/1999 | Yonenaga et al. | 118/715 |
| 2002/0086553 A1 | | 7/2002 | O'Donnell et al. | |
| 2006/0159909 A1 | * | 7/2006 | Aslan et al. | 428/323 |

FOREIGN PATENT DOCUMENTS

| | | |
|---|---|---|
| DE | 20316044 U1 | 3/2005 |
| GB | 2158368 A | 11/1985 |
| WO | 2005/103327 A1 | 11/2005 |
| WO | 2007/064520 A1 | 6/2007 |

OTHER PUBLICATIONS

International Search Report for PCT/CH2009/000355 dated Feb. 17, 2010.

* cited by examiner

*Primary Examiner* — Michael Wieczorek
(74) *Attorney, Agent, or Firm* — Pearne & Gordon LLP

(57) ABSTRACT

The present invention relates to a pretreatment method to be applied to secondary surfaces in coating systems prior to coating. To this end, a non-stick coating is applied to the secondary surfaces, which can be easily detached from the secondary surfaces, even after coating material has been deposited thereon. In this way, the cleaning process of the coating system after the coating process is considerably simplified.

5 Claims, 2 Drawing Sheets

CLEANING METHOD FOR COATING SYSTEMS

TECHNICAL FIELD THE INVENTION TO WHICH THE INVENTION PERTAINS

Figure 1:
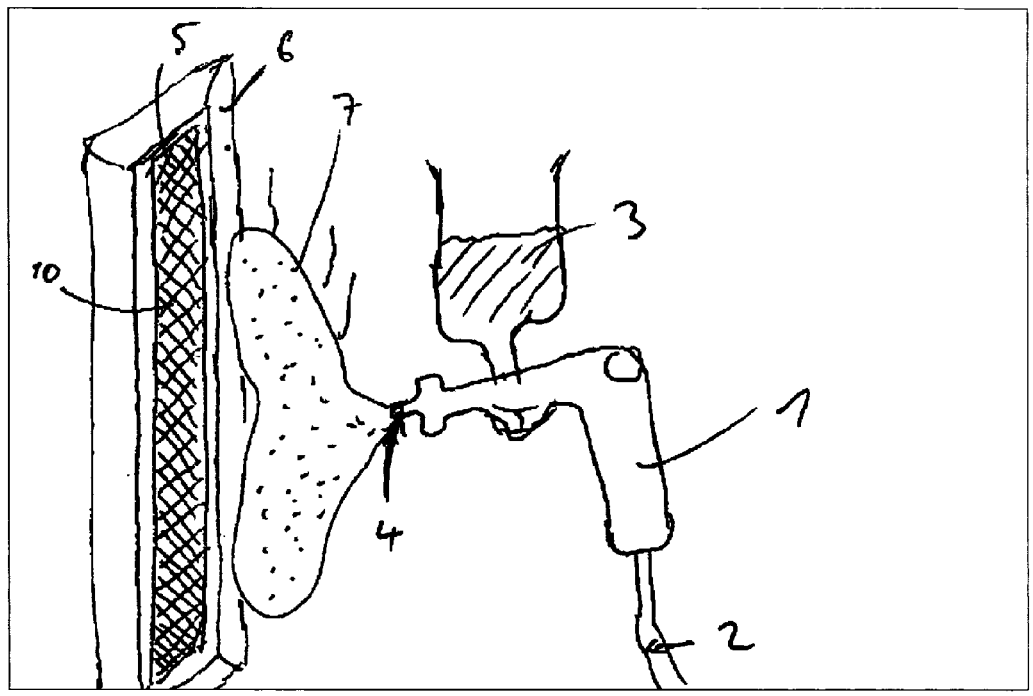

The invention relates to a cleaning method in connection with coating systems, in particular in connection with vacuum coating systems. During the coating process, it is generally unavoidable for surfaces to be coated in the coating chamber for which coating is not desired. Such surfaces can for example be parts of the chamber as well as parts of the substrates to be coated as well as holding surfaces or other secondary surfaces. After one or several coatings, these must generally be painstakingly cleaned. This is in particular necessary when the coating on the surfaces for which coating is not desired affects their surface characteristics, such as for example their electric conductivity. Thanks to the inventive method, this cleaning is made considerably simpler. In the frame of this invention disclosure, the unintentionally coated surfaces are called secondary surfaces whilst the deliberately coated surfaces are referred to as target surfaces.

STATE OF THE ART TO DATE

It is known in the state of the art how to remove such undesirable coatings by means of different methods, such as for example sandblasting, grinding, scrubbing or even mechanical post-processing or chemical stripping processes. All these methods are common practice and widely used in the industry. Because of the usually great adhesive strength of these unwanted coatings on the secondary surfaces, their removal is almost consistently very time-consuming. In some cases, the secondary surfaces need to be cleaned after each coating process (batch). Cleaning methods, for example wet-chemical stripping or sandblasting.

Additionally, all abrasive cleaning methods (sandblasting, grinding etc.) entail considerable additional material wear for the processed components. This causes additional high maintenance costs (replacement of the worn components).

Furthermore, this material wear causes reduced process reliability, since in some circumstances mechanical tolerances relevant for the coating process can no longer be complied with.

TECHNICAL TASKS OF THE PRESENT INVENTION

It would therefore be desirable for a method to be made available that would at least overcome the disadvantages of the state of the art. It would concretely be desirable to have a simplified cleaning method for secondary surfaces that can additionally be performed with considerably less time expenditure and that does not cause material wear of the components that are to be cleaned.

INDICATION OF THE GENERAL SOLUTION RESP. OF THE APPROACH

The basic idea of the present invention is to subject, even prior to the coating process, the secondary surfaces to a pre-treatment such that during the subsequent coating process, the adhesiveness of the coating material on the secondary surfaces is considerably reduced by comparison with adhesiveness without pre-treatment. In this manner, the cleaning process is made considerably easier.

Such an inventive pre-treatment can for example consist in applying a suitable "anti-adhesive layer" onto the secondary surfaces. The anti-adhesive layer is characterized by a low adhesiveness on the secondary surfaces. As the "anti-adhesive layer" after the coating itself ends up being between the secondary surface and the material deposited during the coating process, the adhesiveness of the coating material is effectively inhibited. Depending on the kind of coating process, the anti-adhesive layer needs to be temperature-resistant, electrically conductive and neutral from the point of view of vacuum technology. In particular neutrality for vacuum technology constitutes a prerequisite for PVD processes. The application of the anti-adhesive coating should preferably not have any negative influence of the properties of the layer itself on the target surfaces.

DETAILED DESCRIPTION OF THE INVENTION

The invention will now be explained in detail on the basis of examples and with the aid of the figures.

FIG. 1 sketches the process of the inventive pre-treatment.

Figure 2:
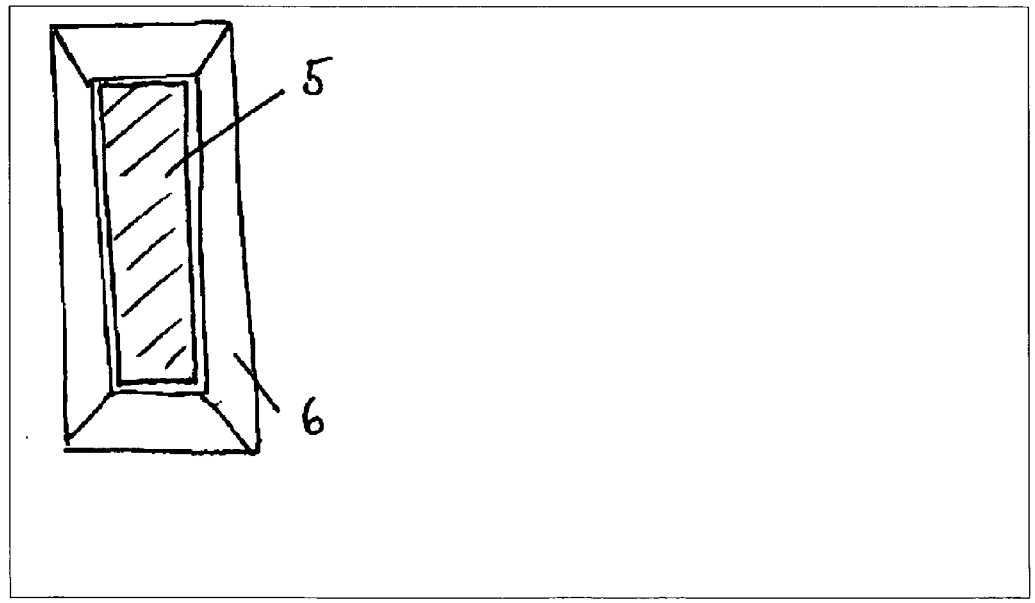

FIG. 2 sketches an example for the use of a masking screen.

Figures 3, 4:
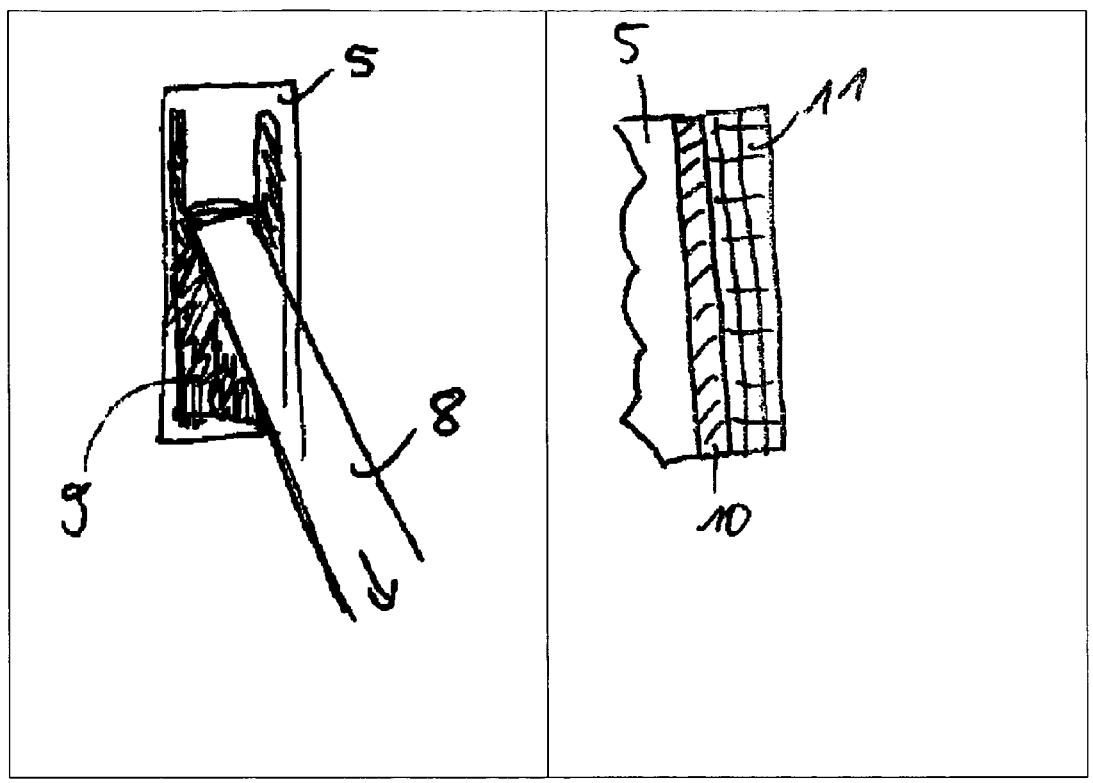

FIG. 3 sketches the facilitated cleaning process after the coating process.

FIG. 4 sketches the cross section through a surface provided with an anti-adhesive layer and a coating.

The following description is limited to a PVD process, though the frame of the invention is not to be limited to such a process.

For such a PVD process, it is important that the anti-adhesive layer should be suitable for vacuum. This however means that the anti-adhesive layer cannot contain any bonding agents or similar additives.

The inventors have discovered that this can be achieved if a powder suspension in a slightly volatile solvent in a suitable mixing ratio is used when applying the anti-adhesive layer on the secondary surfaces. The slightly volatile solvent cannot enter into a chemical bond with the used powder or the treated surface. By using a volatile solvent as carrier medium for the suspension, it can be ensured that the solvent has already completely evaporated immediately after the spraying process and only a weakly adhesive powder layer remains on the surface. As a solvent, isopropanol for example is very well suited.

The inventors have further discovered that pure graphite is suitable as powder material. Graphite powder, under vacuum, is in particular sufficiently temperature-resistant, electrically conductive and suitable for vacuum processes, and it fulfills anti-adhesive properties and can thus be used in the PVD process.

The aim is achieved for example by spraying using a spray gun. This can be done without additional gas or with gas support. In the latter case, atmospheric nitrogen but also $CO_2$ are suitable. The influencing factors that are relevant for the spraying process (e.g. injection pressure, pistol nozzle size, suspension mixing ratio, spraying distance and duration) can be adjusted in many ways in order to provide a homogenous layer application of adequate thickness for a plurality of applications. Depending on the application, other application methods (brushing, dipping, etc.) are also possible.

The anti-adhesive layer ensures that during the PVD process, coating material that is deposited on the treated secondary surfaces can essentially be removed entirely by simple aspiration and/or wiping. A further post-treatment is not necessary, the secondary surfaces can immediately be provided again with a new anti-adhesive layer for the next use.

Thanks to the outstanding good effectiveness and simplicity of use, many different applications, for example in the context of the PVD process, are conceivable.

In connection with arc evaporation, so-called confinement rings are often used. These surround the evaporation source's target having the coating material and ensure that the arc remains limited to the area of the target surface. Because of its proximity to the target material, they are subjected to a strong material application during the PVD coating process and their cleaning so far has required extremely aggressive methods such as for example sandblasting or even post-processing by machining. With the inventive application of the graphite powder, the necessary electric conductivity is retained. The coating material deposited during the PVD process ends up on the graphite layer. The graphite layer, including the coating, is then easily removed from the confinement ring.

The same applies for substrate holders that hold, during the coating process, the substrates to be coated. Because of their spatial proximity to the substrates to be coated, they are also heavily coated. After coating, the substrate holders have so far needed to be treated in time-consuming and therefore cost-intensive manner. Sandblasting causes high wear. In addition to the reduced process reliability, the expensive holders therefore needed to be replaced frequently. If the substrate holders are pre-treated with an anti-adhesive layer according to the invention, they can be cleaned after the PVD process easily, quickly and without wear.

The same goes for the carousel and the evaporation protection plate of a PVD installation. If the installation further includes anodes to provide a plasma discharge, for example sputter sources, low voltage arc discharges and etching equipment, these can advantageously also be pre-treated prior to a coating step by application of an anti-adhesive layer.

As a concrete example of embodiment, the inventive applied method for cleaning coated anode surfaces that are part of the etching device in the coating system will be described hereinafter in detail.

The problem represented here lies in the fact that for each PVD process, the anode surface is strongly coated with firmly adhering material. If further layers are added in subsequent coating processes, a very thick deposit that is extremely difficult (time-consuming) to remove will result in the course of time.

If layers poorly or not conductive layers are deposited, the poorly or not conductive deposits on the anode can cause the function of the anode to be impaired already after one coating process, so that for such processes the anode imperatively needs to be cleaned after each batch.

In order to perform this cleaning process, it is possible to proceed for example in the following manner:

The starting point is an anode, free from deposits and residues, i.e. the "virgin" anode even before the first coating process or after a cleaning treatment.

In a first step, the immediate vicinity of the anode with a surface that is to be coated with an anti-adhesive layer, representing in this case a secondary surface according to the definition given in this description, is covered and/or masked. A masking sheet with an adapted cutout and appropriate geometry can for example be an option. The masking sheet ensures that only the desired areas are provided with an anti-adhesive layer.

In a second step, the anti-adhesive layer is applied for example with a spraying method using a spray gun. In this case, a suspension containing the anti-adhesive layer material is sprayed onto the masked anode.

In order to prepare the suspension to be sprayed, graphite powder is mixed into isopropanol. In the described example, the anode is a vertically mounted metallic surface. It is therefore necessary to take care that the spraying distance and layer thickness are selected in such a way that excess solvent is prevented from running down onto the surface. It is thus very advantageous if the slightly volatile solvent can already evaporate to a large extent while on its way between the spray nozzle and the surface to be treated. This results in an optimum coating with graphite powder. In this context, the mixing ratio of solvent and graphite powder also plays a role. In order to prevent any running down, the proportion of graphite should be as high as possible. However, it is also necessary to take care that the nozzle of the spray gun does not become clogged. A ratio of 50 ml to 150 ml of isopropanol (IPA) for 10 g of graphite powder has proved suitable. Preferably, 100 ml IPA per 10 g of graphite powder is used.

The graphite powder used should be to a large extent without adjunction of bonding agents or other additives. In the present example, a purity of 99.9% was used. As regards the particle size of the graphite powder, 0.2 µm to 150 µm as maximum size have proved favorable. Advantageously, a graphite powder with particles not larger than 20 µm is used.

As spray gun, a commercially available gravity-fed spray gun was used. The nozzle size lies for example between 0.3 mm and 2 mm and is preferably 0.8 mm.

As medium for driving the spraying process, compressed air at a pressure between 0.2 bar and 1.0 bar, preferably between 0.5 bar and 0.7 bar, was used. The compressed air should be free of oil and as far as possible free of particles so that no impurity contaminates the suspension and thus the anti-adhesive layer. Particular care must be taken that the pistol's pneumatics does not introduce any impurities.

Prior to each use, the suspension is homogenized. This can occur by shaking, vibrating, by ultrasound treatment or other methods known to the one skilled in the art.

A spraying distance between 50 mm and 250 mm, ideally between 100 mm and 200 mm, is chosen. As already mentioned above, a great spraying distance is advantageous inasmuch as the solvent is given the opportunity to evaporate already during its flight time. A distance that is too great will however result in a wide spatial dispersion.

The layer thickness to be applied for the anti-adhesive layer is for example between 0.05 mm and 2.0 mm. In the present example, the criterion "optically-assessed extensive coverage" has proved suitable and, because of its simplicity, advantageous. At least if the secondary surfaces are themselves not graphite surfaces, it is easy to perform this on the basis of the optical characteristics of graphite powder. The application of the anti-adhesive layer takes place in the example in several and advantageously uniform spraying steps.

After application of the anti-adhesive layer, it is important to bear in mind that since the powder layer adheres to the surface essentially through adhesion forces, touching the coated secondary surfaces after the spraying should be avoided as much as possible. It is therefore advantageous, whenever possible, to treat the components in their final assembled state or accordingly to use suitable devices and/or tools (handling aids) so that any damage to the anti-adhesive layer can be avoided.

In a third step, the screen used for masking is removed. Attention is drawn again to the fact that such a masking is not required in every case, though it was used in this example.

The pre-treatment is thus completed and the PVD coating itself can be carried out in the usual manner, i.e. the coating chamber is loaded with work-pieces, the chamber is closed and pumped out, the coating, e.g. arc evaporation, takes place and the coating chamber is then aired and opened. The inventive pre-treatment of the anode has in this respect no influence on the coating.

After opening the coating chamber, the anti-adhesive layer with the deposits that have accumulated on it is simply extracted by aspiration, for example by means of an industrial vacuum cleaner. If necessary or desired, the anode can also be wiped with cleaning alcohol.

Before the next coating process, the anode is again pre-treated according to the steps 1 to 3.

Ideally, this procedure is performed after each coating process. It is however also possible to forgo the aspiration of the anti-adhesive layer after a coating step and to renew the anti-adhesive layer only after several coating cycles.

The invention has been described by way of example on the basis of a PVD coating system and of the pre-treatment of an ITE-anode placed in a vacuum chamber (ITE=Innova Etching Technology). In this example, the cleaning effort of 20 minutes so far could be reduced to a couple of minutes. Furthermore, the anode is protected from wear through the inventive method. The inventive pre-treatment can advantageously be used with other coating methods, in particular with other vacuum coating methods. If necessary, the material of the anti-adhesive layer could then be adapted.

Further examples of applications have already been mentioned. In particular, the invention can also be used advantageously for substrates to be coated in the case where for example only one part of the substrate surface is to be coated. So far, the surface parts of the substrates that were not to be coated had to be shielded by the holding fixtures. By means of the inventive method, on the other hand, the parts of the substrate surface that are not to be coated are covered with an anti-adhesive layer which after coating can be aspirated and/or wiped off in a simple manner.

For often recurring similar anti-adhesive treatments (e.g. carousels, substrate holders, substrates etc.), using an automatically operating spraying installation in a further development of the present invention is advantageous.

Broadly, the present invention can be summarized with the following points:

Point 1: Pre-treatment methods for coating methods, characterized in that the secondary surfaces of a coating system are subjected even prior to the coating process to a pre-treatment such that during the subsequent coating process, the adhesiveness of the coating material on the secondary surfaces is considerably reduced by comparison with adhesiveness without pre-treatment.

Point 2: Method according to point 1, characterized in that during the course of the pre-treatment, an anti-adhesive layer is applied onto the secondary surfaces.

Point 3: Method according to point 2, characterized in that the anti-adhesive layer includes a suspension of powder in a volatile solvent, preferably slightly volatile solvent.

Point 4: Method according to point 3, characterized in that the powder material is graphite powder, preferably essentially pure graphite powder.

Point 5: Method according to one of the points 2 to 4, characterized in that the anti-adhesive layer is sprayed by means of a spray gun.

Point 6: Method including a pre-treatment method according to one of the points 2 to 5, as well as a subsequent coating method, characterized in that after one or several coating cycles, the anti-adhesive layer is removed

REFERENCE SIGNS IN THE FIGURES

1 Gravity-fed spray gun
2 Compressed air inlet
3 Suspension
4 Spray nozzle
5 Secondary surface
6 Masking screen
7 Spray mist
8 Vacuum nozzle
9 Anti-adhesive layer covered with deposits
10 Anti-adhesive layer
11 Deposits from the PVD process

The invention claimed is:

1. A pre-treatment method for a physical vapor deposition (PVD) coating process, the method comprising:
   subjecting secondary surfaces of a coating system prior to the PVD coating process to a treatment such that, during the PVD coating process, an adhesiveness of a coating material on the secondary surfaces is reduced by comparison with adhesiveness without pre-treatment,
   wherein, in the course of the pre-treatment, an anti-adhesive layer is applied onto the secondary surfaces, the anti-adhesive layer including a suspension of powder in a volatile solvent, and
   wherein, after performing one or more coating cycles of the PVD process, the anti-adhesive layer is removed.

2. The method according to claim 1, wherein the powder material is graphite powder.

3. The method according to claim 2, wherein the powder material is pure graphite powder.

4. The method according to claim 1, wherein the anti-adhesive layer is sprayed by means of a spray gun.

5. A physical vapor deposition (PVD) coating method, comprising:
   performing one or more PVD coating cycles, comprising:
      performing a pre-treatment method for a PVD coating process, the pre-treatment method comprising subjecting secondary surfaces of a coating system prior to the PVD coating process to a treatment such that, during the PVD coating process, an adhesiveness of a coating material on the secondary surfaces is reduced by comparison with adhesiveness without pre-treatment, an anti-adhesive layer being applied onto the secondary surface in the course of the pre-treatment, the anti-adhesive layer including a suspension of powder in a volatile solvent; and
      performing the PVD coating process,
   wherein, after the performing of the one or more coating cycles, the anti-adhesive layer is removed.

* * * * *